(12) United States Patent
Kim et al.

(10) Patent No.: US 11,322,502 B2
(45) Date of Patent: May 3, 2022

(54) APPARATUS INCLUDING BARRIER MATERIALS WITHIN ACCESS LINE STRUCTURES, AND RELATED METHODS AND ELECTRONIC SYSTEMS

(71) Applicant: Micron Technology, Inc., Boise, ID (US)

(72) Inventors: Dojun Kim, Boise, ID (US); Christopher W. Petz, Boise, ID (US); Sanket S. Kelkar, Boise, ID (US); Hidekazu Nobuto, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 16/504,681

(22) Filed: Jul. 8, 2019

(65) Prior Publication Data

US 2021/0013213 A1  Jan. 14, 2021

(51) Int. Cl.
 *H01L 27/108* (2006.01)
 *G11C 5/06* (2006.01)
(52) U.S. Cl.
 CPC ........ *H01L 27/10891* (2013.01); *G11C 5/063* (2013.01); *H01L 27/10805* (2013.01)
(58) Field of Classification Search
 CPC ......... H01L 27/10891; H01L 27/10805; G11C 5/063
 See application file for complete search history.

(56) References Cited

U.S. PATENT DOCUMENTS

| | | |
|---|---|---|
| 6,204,205 B1 | 3/2001 | Yu et al. |
| 6,373,114 B1 | 4/2002 | Jeng et al. |
| 7,494,873 B2 | 2/2009 | Forbes et al. |
| 8,309,448 B2 | 11/2012 | Hwang et al. |
| 10,002,874 B2 | 6/2018 | Nobuto |
| 10,256,167 B1 | 4/2019 | Fukuo et al. |
| 2006/0216932 A1* | 9/2006 | Kumar ............... H01L 21/7681 438/641 |
| 2008/0044986 A1 | 2/2008 | Storbeck et al. |
| 2009/0032949 A1 | 2/2009 | Goswami |
| 2010/0007022 A1* | 1/2010 | Tarumi ............ H01L 23/53238 257/751 |

(Continued)

OTHER PUBLICATIONS

Moriwaki et al., Influences of Residual Chlorine in CVD-Tin Gate Electrode on the Gate Oxide Reliability in Multiple-Thickness Oxide Technology, Jpn. J. App. Phys. vol. 40, (2001), pp. 2679-2684.

(Continued)

*Primary Examiner* — Fernando L Toledo
*Assistant Examiner* — Neil R Prasad
(74) *Attorney, Agent, or Firm* — TraskBritt

(57) ABSTRACT

An apparatus comprising a memory array comprising access lines. Each of the access lines comprises an insulating material adjacent a bottom surface and sidewalls of a base material, a first conductive material adjacent the insulating material, a second conductive material adjacent the first conductive material, and a barrier material between the first conductive material and the second conductive material. The barrier material is configured to suppress migration of reactive species from the second conductive material. Methods of forming the apparatus and electronic systems are also disclosed.

26 Claims, 6 Drawing Sheets

(56) References Cited

U.S. PATENT DOCUMENTS

| | | | | |
|---|---|---|---|---|
| 2010/0052181 A1* | 3/2010 | Werner | ............ | H01L 21/76829 |
| | | | | 257/773 |
| 2011/0027988 A1* | 2/2011 | Hwang | ............ | H01L 27/10876 |
| | | | | 438/656 |
| 2011/0280077 A1* | 11/2011 | Fishburn | ............ | H01L 29/7827 |
| | | | | 365/185.18 |
| 2012/0231626 A1* | 9/2012 | Lee | .................... | C23C 16/0272 |
| | | | | 438/653 |
| 2015/0349073 A1* | 12/2015 | Kang | ............... | H01L 27/10891 |
| | | | | 257/330 |
| 2017/0186844 A1* | 6/2017 | Kim | ..................... | H01L 29/517 |
| 2017/0352559 A1* | 12/2017 | Liu | ................... | H01L 21/67063 |
| 2017/0373197 A1 | 12/2017 | Sharangpani et al. | | |
| 2019/0027537 A1* | 1/2019 | Wiegand | ........... | H01L 21/76843 |
| 2019/0348369 A1* | 11/2019 | Naik | ................... | H01L 23/5226 |
| 2019/0355621 A1* | 11/2019 | Marcadal | ......... | H01L 21/76879 |
| 2020/0303240 A1* | 9/2020 | Chang | .............. | H01L 27/10891 |

OTHER PUBLICATIONS

Lim et al., Atomic Layer Deposition- and Chemical Vapor Deposition-TiN Top Electrode OPtimization for the Reliability of Ta2O5 and Al2O3 Metal Insulator Silicon Capacitor for 0.13 $\mu$m Technology and Beyond, Jpn. J. Appl. Phys. vol. 40, (2001), pp. 2669-2673.

* cited by examiner

APPARATUS INCLUDING BARRIER MATERIALS WITHIN ACCESS LINE STRUCTURES, AND RELATED METHODS AND ELECTRONIC SYSTEMS

TECHNICAL FIELD

Embodiments disclosed herein relate to microelectronic devices and microelectronic device fabrication. More particularly, embodiments of the disclosure relate to an apparatus including barrier materials between two conductive materials within access line structures, and to related electronic systems and methods of forming the apparatus.

BACKGROUND

A memory device, such as a dynamic random access memory (DRAM) device, includes numerous memory cells, with each memory cell storing one bit of information. A memory cell includes a memory storage element (e.g., a capacitor) and an access device (e.g., a transistor) operably coupled to the memory storage element. A source region or a drain region of the transistor is electrically connected to one of the capacitor terminals. The other of the source region or the drain region and a gate electrode of the transistor are connected to a digit line (e.g., a bit line) and an access line (e.g., a wordline), respectively. In addition, the other capacitor terminal is connected to a reference voltage. The transistor includes a channel region between the source region and the drain region and further includes a gate configured to electrically connect the source region and drain region to one another through the channel region. The channel region includes a semiconductor material, such as silicon. The memory cells are arranged in a matrix of rows and columns.

As DRAM technology advances, memory cells have been scaled down in size to increase the density of the memory cells. The increase in density increases the storage capacity of the DRAM device. However, the increased density also leads to a decrease in spacing between adjacent wordlines, which increases the coupling effect between the adjacent wordlines. For example, when a row (e.g., a wordline) in the matrix is repeatedly activated and refreshed, noise may be injected into the adjacent row (e.g., a victim row), such that data corruption may occur in one or more memory cells in the victim row. The repeated activation and refreshing of the row are referred to as a so-called "row hammer" effect. A so-called "row hammer event" occurs when a refresh command is executed to refresh wordlines that are adjacent to a hammered wordline. A particular wordline is "hammered" when it is accessed via memory access operations, such as an active command, in a manner that potentially leads to data errors in adjacent wordlines. Leakage and parasitic currents caused by the hammering of a row may cause data corruption in a non-accessed physically adjacent row (e.g., the victim row). In some instances, such leakage and parasitic currents may be the result of degradation of a gate dielectric material (e.g., a gate oxide) during use and operation of the DRAM device and/or during formation thereof. For example, formation of chlorine-related trap sites during deposition of conductive materials and/or during process acts to remove (e.g., etch) portions of the conductive materials may result in defects within (e.g., at the interface of) the gate dielectric material. Chlorine or other reactive species may diffuse into the gate dielectric material and form trap sites during the deposition of the conductive material. The trap sites increase a threshold voltage and gate leakage in the DRAM device.

Some approaches to reduce the adverse effects of row hammering on adjacent rows include refreshing adjacent rows responsive to a determination that the row hammer event has occurred. For example, responsive to determining that a particular row has been the target of repeated accesses (e.g., the row has undergone more than a threshold number of accesses within a refresh period), the physically adjacent neighbor rows may be selected for a targeted refresh operation, which may be referred to as a row hammer refresh operation. However, in conventional DRAM devices, row hammer performance is insufficient.

DETAILED DESCRIPTION

Figure 1A:
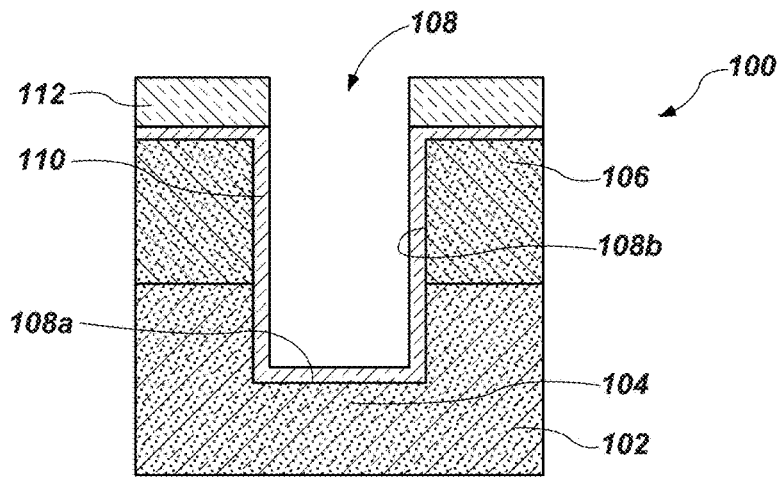
FIGS. 1A through 1F are simplified, partial cross-sectional views illustrating various stages of forming an apparatus including an access line structure, in accordance with embodiments of the disclosure.

An apparatus (e.g., an electronic device, a semiconductor device, a memory device) is disclosed that includes an access line structure (e.g., a wordline structure) including a barrier material between two conductive materials. The barrier material may be configured to reduce migration (e.g., diffusion) of reactive species from a conductive material. The reactive species may be produced during fabrication of one or more of the conductive materials or during a removal act of one or more of the conductive materials. The access line structure also includes an insulating material to isolate the conductive materials of adjacent access line structures. In some embodiments, a thickness of the conductive material located adjacent the insulating material may be relatively less than a thickness of another conductive material located in a central portion of an access line trench, and a thickness of the barrier material may be relatively less than a thickness of each of the conductive materials. The conductive materials and the barrier material of the access line structure may be formed in situ (e.g., in the same deposition device) using a single, continuous ALD process, a single, continuous CVD process, a single wafer process, or a furnace process, for example. The barrier material may substantially inhibit (e.g., impede, prevent) the formation of so-called "trap sites" within the insulating material of the apparatus. The apparatus including the access line structure exhibits improved row hammer performance properties compared to conventional apparatuses lacking the barrier material between the two conductive materials.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional fabrication techniques employed in the semiconductor industry. In addition, the description provided below does not form a complete process flow for manufacturing an apparatus. The structures described below do not form a complete microelectronic device. Only those process acts and structures necessary to understand the embodiments of the disclosure are described in detail below. Additional acts to form a complete microelectronic device may be performed by conventional fabrication techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), a single wafer process, or furnace growth (e.g., diffusion). Further, formation processes may be performed continuously or as a batch process. Alternatively, the materials may be grown in situ. Depending on the specific material to be formed, the technique for depositing or growing the material may be selected by a person of ordinary skill in the art. The removal of materials may be accomplished by any suitable technique including, but not limited to, dry etching, wet etching, wet cleaning, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, material composition, orientation, and arrangement of one or more of at least one structure and at least one apparatus facilitating operation of one or more of the structure and the apparatus in a pre-determined way.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "apparatus" includes without limitation a memory device, as well as other microelectronic devices (e.g., semiconductor devices) which may or may not incorporate memory, such as a logic device, a processor device, or a radiofrequency (RF) device. Further, the apparatus may incorporate memory in addition to other functions such as, for example, a so-called "system on a chip" (SoC) including a processor and memory, or an apparatus including logic and memory. The apparatus may be a 3D microelectronic device including, but not limited to, a 3D NAND Flash memory device, such as a 3D floating gate NAND Flash memory device or a 3D replacement gate NAND Flash memory device.

As used herein, the term "barrier material" means and includes a material formulated to substantially inhibit (e.g., substantially reduce, substantially prevent) reactive species from diffusing from conductive materials and into an adjacent insulating material. Without the barrier material being present, weaknesses (e.g., trap sites) may form in the insulating material (e.g., a gate dielectric material) due to the diffusion of the reactive species.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1F are simplified partial cross-sectional views illustrating embodiments of a method of forming an apparatus (e.g., a microelectronic device, such as a DRAM device) including access line structures (e.g., wordline structures) at various stages of the method. For simplicity, the formation of a single access line structure is illustrated, but it will be understood by one of ordinary skill in the art that the method includes forming multiple (e.g., more than one, an array of) apparatuses including such access line structures. With the description provided below, it will be readily apparent to one of ordinary skill in the art that the methods described herein may be used in fabrication of various apparatus. In other words, the methods of the disclosure may be used whenever it is desired to form the apparatus.

Referring to FIG. 1A, a partially fabricated access line structure 100 for use in an apparatus (e.g., an electronic device, a memory device (e.g., a DRAM memory device)) is shown. The apparatus includes the access line structure 100, a base material 102, an active area 104 within the base material 102, and a drain region 106 within the base material 102. As shown in FIG. 1A, portions of the base material 102 are selectively removed to form access line trenches 108 having a bottom surface 108a and side surfaces 108b (e.g., sidewalls) corresponding to locations where conductive lines (e.g., access lines, wordlines) are ultimately to be formed. The access line trenches 108 (e.g., wordline trenches) traverse the active area 104 of the base material 102. In the active area 104, a pair of the access line trenches 108 may separate a source region 226 (see FIG. 2) from the drain regions 106, with the drain regions 106 disposed to either side of (e.g., laterally adjacent to) the source region 226. The source region 226 and drain regions 106 may be defined by doped areas of the base material 102 proximate an upper surface of the base material 102. For example, the source region 226 and the drain regions 106 may be doped with an n-type dopant or with a p-type dopant, as known in the art. The source region 226 and the drain regions 106 may be formed in the active area 104 by conventional techniques. The access line trenches 108 may be defined by the side surfaces 108b and the bottom surface 108a of the base material 102.

The access line structure 100 also includes a first insulating material 110 and a second insulating material 112 adjacent (e.g., vertically overlying) at least a portion of the first insulating material 110. The first insulating material 110 may be formed within the access line trenches 108 and over the base material 102, while the second insulating material 112 may be formed over the first insulating material 110 outside the access line trenches 108. For example, the first insulating material 110 may be conformally formed on the bottom surface 108a and on the side surfaces 108b of the access line trenches 108 and on upper surfaces of the base material 102 adjacent to (e.g., located outside of) the access line trenches 108. The first insulating material 110 may be conformally formed on the upper surfaces, the bottom surface 108a and the side surfaces 108b of the base material 102 by conventional techniques. As shown in FIG. 1A, upper surfaces of the first insulating material 110 within the access line trenches 108 may be exposed, while upper surfaces of the first insulating material 110 adjacent to (e.g., external to) the access line trenches 108 are at least partially (e.g., substantially) covered by the second insulating material 112. In other embodiments, the second insulating material 112 may also be formed over the first insulating material 110 within the access line trenches 108. The first insulating material 110 and the second insulating material 112 together may form a so-called "gate dielectric" material. The first insulating material 110 and the second insulating material 112 may be formed by conventional techniques, which are not described in detail herein. The first insulating material 110 may be formed to any desirable thickness. By way of non-limiting example, the first insulating material 110 may be formed to a thickness of between about 15 Angstroms (Å) and about 150 Å, such as between about 15 Å and about 30 Å, between about 30 Å and about 50 Å, between about 50 Å and about 100 Å, or between about 100 Å and about 150 Å.

The first insulating material 110 and the second insulating material 112 may each be formed of and include at least one dielectric material including, but not limited to, an oxide, a nitride, or an oxynitride. The first insulating material 110 and/or the second insulating material 112 may be formed of and include at least one oxygen-containing dielectric material, such as one or more of a dielectric oxide material (e.g., one or more of a silicon oxide ($SiO_x$), phosphosilicate glass, borosilicate glass, borophosphosilicate glass, fluorosilicate glass, aluminum oxide ($AlO_x$), hafnium oxide ($HfO_x$), niobium oxide ($NbO_x$), and titanium oxide ($TiO_x$)), a nitrogen-containing dielectric material (e.g., a silicon nitride ($SiN_y$), a dielectric oxynitride material (e.g., silicon oxynitride ($SiO_xN_y$)), or a dielectric carboxynitride material (e.g., silicon carboxynitride ($SiO_xC_zN_y$)), where each of x, y, z is independently an integer or a non-integer. The dielectric material may be a stoichiometric compound having one of the above chemical formulae or a non-stoichiometric compound having one of the above chemical formulae. The first insulating material 110 and the second insulating material 112 may be the same material (e.g., chemical composition) as one another or a different material (e.g., chemical composition) from one another. In some embodiments, at least one of (e.g., each of) the first insulating material 110 and the second insulating material 112 is formed of and includes $SiO_x$ (e.g., silicon dioxide ($SiO_2$)). In other embodiments, the material of the first insulating material 110 may be formed of a different material having a different etch selectivity than that of the second insulating material 112.

Figure 1B:
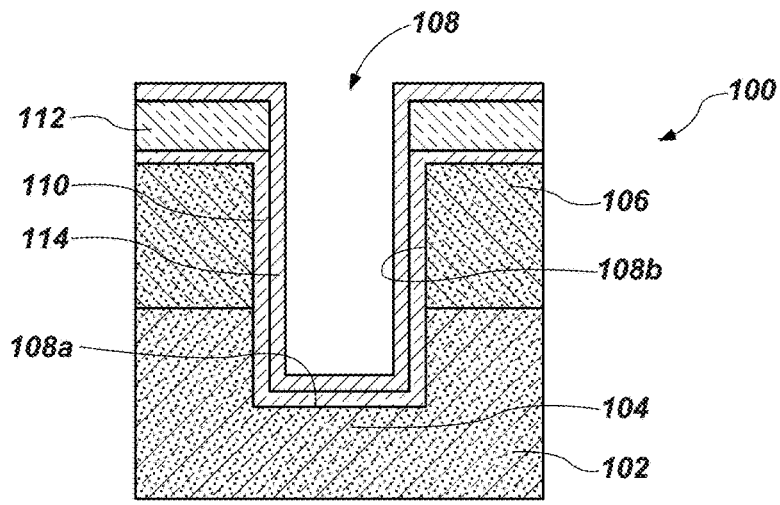

Referring next to FIG. 1B, a first conductive material 114 may be formed in the access line trenches 108 and over upper surfaces of the second insulating material 112. In particular, the first conductive material 114 may be conformally formed adjacent (e.g., over) the upper surfaces of the second insulating material 112 and the bottom surface 108a and the side surfaces 108b within the access line trenches 108. As shown in FIG. 1B, the first conductive material 114 substantially covers exposed surfaces of the first insulating material 110 and the second insulating material 112. The first conductive material 114 may be formed to exhibit any desirable thickness. By way of non-limiting example, the first conductive material 114 may be formed to a thickness of between about 15 Å and about 150 Å, such as between about 15 Å and about 30 Å, between about 30 Å and about 50 Å, between about 50 Å and about 100 Å, or between about 100 Å and about 150 Å. The thickness of the first conductive material 114 may be substantially uniform along its length.

The first conductive material 114 may be formed of and include at least one electrically conductive material. By way of non-limiting example, the first conductive material 114 may be a metal material (e.g., a transition metal material) or a metal nitride material (e.g., a transition metal nitride material), such as one or more of titanium nitride ($TiN_y$), tungsten (W), tungsten nitride ($WN_y$), tantalum nitride ($TaN_y$), molybdenum nitride ($MoN_y$), or ruthenium (Ru), where y is independently an integer or a non-integer. In some embodiments, the first conductive material 114 comprises a titanium nitride $TiN_y$, such as TiN. In other embodiments, the first conductive material 114 comprises tungsten (W). In yet other embodiments, the first conductive material 114 comprises ruthenium (Ru).

The first conductive material 114 may be formed using one or more conventional conformal deposition techniques, including, but not limited to one or more of a conventional CVD process, a conventional ALD process, a single wafer process, or a conventional furnace process. To form the first conductive material 114, the access line structure 100 (at the processing stage depicted in FIG. 1A) may be disposed in a conventional deposition device (e.g., a single chamber of a conventional ALD reactor, a conventional CVD reactor, a conventional single wafer device, or a conventional furnace) and alternating pulses of at least one metal-containing precursor and at least one nitrogen-containing precursor introduced to the deposition device in a continuous process or a batch process. The metal-containing precursor and the nitrogen-containing precursor may be conventional CVD precursors or ALD precursors. The metal-containing precursor may, for example, include a complex of at least one metal (e.g., Ti, W, Ta, Co, Mo, Ni) of the first conductive material 114 and at least one ligand formulated to react with the nitrogen-containing precursor to form at least a portion of the first conductive material 114. A monolayer or less of the metal from the metal-containing precursor and a monolayer or less of the nitrogen from the nitrogen-containing precursor may be formed sequentially until a desired thickness of the first conductive material 114 is achieved. The first conductive material 114 may form a substantially continuous material over the first insulating material 110 and the second insulating material 112. In some embodiments, the metal-containing precursor comprises titanium tetrachloride ($TiCl_4$) and the nitrogen-containing precursor comprises ammonia ($NH_3$). In some embodiments, the first conductive material 114 may be formed in situ. The first conductive material 114 may facilitate (e.g., improve) adhesion of subsequent materials to the first insulating material 110.

Figure 1C:
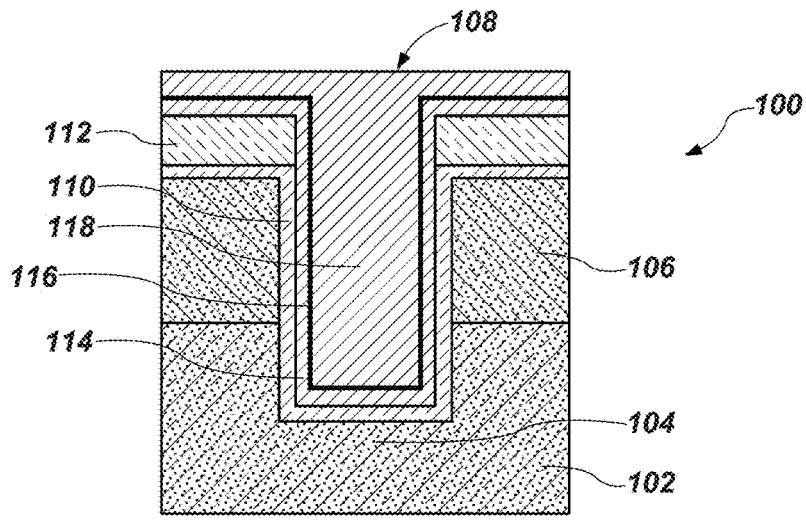

Referring to FIG. 1C, a barrier material 116 may be formed adjacent to (e.g., on or over) surfaces of the first conductive material 114. For example, the barrier material 116 may be conformally formed on exposed side surfaces and exposed upper surfaces of the first conductive material 114 and may at least partially (e.g., substantially) cover exposed surfaces of the first conductive material 114. The barrier material 116 may be formed at any desirable thickness. By way of non-limiting example, the barrier material 116 may be formed to a thickness of between about 0.5 Å and about 30 Å, such as between about 0.5 Å and about 1.5 Å, between about 1.5 Å and about 3.0 Å, between about 3.0 Å and about 4.5 Å, between about 4.5 Å and about 6.0 Å, between about 6.0 Å and about 18 Å, between about 18 Å and about 24 Å, or between about 24 Å and about 30 Å. The thickness of the barrier material 116 may be substantially uniform along its length.

The barrier material 116 may be formed of and include at least one dielectric material through which the reactive species (e.g., ions) do not diffuse. By way of non-limiting example, the barrier material 116 may be formed of and include at least one dielectric material substantially free of oxygen, such as one or more of a dielectric nitride material (e.g., silicon nitride ($Si_xN_y$), boron nitride ($BN_y$), germanium nitride ($GeN_y$), aluminum nitride ($AlN_y$)) and a dielectric carbonitride material (e.g., silicon carbonitride ($SiC_zN_y$)), where each of x, y, z is independently an integer or a non-integer. The barrier material 116 may be a binary or multinary (e.g., ternary) compound. In some embodiments, the barrier material 116 is formed of and includes $Si_xN_y$ (e.g., $Si_3N_4$). In other embodiments, the barrier material 116 may be formed of and include an oxynitride material including, but not limited to, silicon oxynitride ($SiO_xN_y$), boron oxynitride ($BO_xN_y$), germanium oxynitride ($GeO_xN_y$), and aluminum oxynitride ($AlO_xN_y$).

The barrier material 116 may be formed using one or more conventional conformal deposition techniques, such as one or more of a conventional ALD process, a conventional conformal CVD process, a conventional single wafer process, and a conventional furnace process. The formation process may, for example, include exposing the access line structure 100 (at the processing stage depicted in FIG. 1C) to alternating pulses of at least one precursor, such as a silicon precursor, and at least one precursor, such as a nitrogen precursor, with intervening pulses of at least one inert gas (e.g., nitrogen, argon, helium, neon, krypton, xenon, and/or other gases that, although not inert, behave as inert under the conditions of the dielectric formation process) to form the barrier material 116. The silicon and nitrogen precursors may be selected based on the chemical properties (e.g., metal species, ligands) of the barrier material 116 to be formed. In some embodiments, the silicon precursor comprises a silicon-containing compound including a complex of Si and at least one ligand formulated to react with the nitrogen precursor to form at least a portion of the barrier material 116. As a non-limiting example, the silicon precursor may comprise silicon and at least one ligand comprising one or more of hydrogen, nitrogen, and carbon, such as an alkylamido silane compound, including, but not limited to silane ($SiH_4$), disilane (DiSi), dichlorosilane (DCS), tris(dimethylamido) silane (TDMAS), or combinations thereof. In some embodiments, the silicon precursor is DCS. At least one oxidizing agent, including, but not limited to $O_2$, $O_3$, $H_2O$, $H_2O_2$, $N_2O$, for example, may be used in combination with the at least one nitrogen precursor, including, but not limited to $NH_3$, $N_2H_4$). In some embodiments, the oxidizing agent comprises $H_2O$ and the nitrogen precursor comprises $NH_3$.

The barrier material 116 may be formed in situ (e.g., in the same deposition device (e.g., ALD chamber, CVD chamber, a single wafer device, a furnace)) as the first conductive material 114, as well as with subsequent materials (e.g., conductive materials) discussed in greater detail below. The barrier material 116 may, for example, be formed on the first conductive material 114 without first moving (e.g., transferring) the access line structure 100 from the deposition chamber employed to form the first conductive material 114 to another deposition chamber. By way of non-limiting example, if the first conductive material 114 and the barrier material 116 are each formed using an ALD process, a CVD process, a single wafer process, or a furnace process, following the formation of the first conductive material 114, pulses of the silicon precursor (e.g., the Si-containing precursor) and the nitrogen precursor employed to form the barrier material 116 may be introduced into the deposition chamber. The deposition chamber may be purged before introducing the silicon and nitrogen precursors. Accordingly, each of the first conductive material 114 and the barrier material 116 may be formed in the same deposition chamber using a continuous deposition process (e.g., a single, continuous ALD process; a single, continuous CVD process; a single wafer process, or a single, continuous furnace process) or using a batch process. In some embodiments, an ALD process is conducted using sequential pulses of the metal precursor and the nitrogen precursor to form the first conductive material 114 (e.g., $TiN_x$) in an ALD chamber, and then sequential pulses of the silicon precursor and the nitrogen precursor are introduced to the ALD chamber to form the barrier material 116 (e.g., $SiN_x$). In additional embodiments, the first conductive material 114 and/or the barrier material 116 may be formed ex-situ. For example, following the formation of the first conductive material 114, the access line structure 100 may be moved from the deposition device (e.g., the ALD chamber, the CVD chamber, the single wafer device, the furnace) employed to form the first conductive material 114, and transferred to a different deposition device to form the barrier material 116 on the first conductive material 114 through an additional conformal deposition process.

Other processing conditions, such as temperature, pressure, or gas flow rates of the precursors, of the deposition act may be selected as appropriate to achieve the desired composition and thickness of the barrier material 116. By way of non-limiting example, the process temperature within the deposition device (e.g., chamber) may be greater than about 300° C., such as between about 300° C. and about 1000° C., between about 400° C. and about 600° C., or between about 600° C. and about 800° C. Selection of the precursors may at least partially depend on the processing conditions within the deposition device. For example, DCS may be used as the silicon precursor at process temperatures greater than about 600° C. Further, process times for each processing cycle (e.g., loop count) may vary depending on the desired thickness of the barrier material 116. The deposition act may be conducted for an amount of time sufficient to form the barrier material 116 to the desired thickness, with each cycle forming a monolayer or less of silicon and a monolayer or less of nitrogen. As a non-limiting example, each processing cycle of the deposition act may be conducted for from about 0.05 second to about 15 seconds, such as from about 0.05 second to about 2.0 seconds, or from about 1.0 second to about 2.0 seconds. The average thicknesses of the barrier material 116 may at least partially depend on materials, precursors, processing conditions (e.g., temperature), and/or processing times utilized. By way of non-limiting example, the barrier material 116 may be formed using between about 1 deposition cycle and about 25 deposition cycles, such as between about 1 deposition cycle and about 3 deposition cycles, between about 3 deposition cycles and about 10 deposition cycles, between about 10 deposition cycles and about 15 deposition cycles, or between about 16 deposition cycles and about 25 deposition cycles. A thickness of the barrier material 116 may, for example, be less than or equal to about 30 Å, such as within a range of from about 1.2 Å for 1 monolayer to about 30 Å for 25 monolayers depending on the material composition and the processing conditions of the barrier material 116. By way of example only, if the barrier material 116 is a silicon nitride material, the precursor is DCS, and the process temperature is greater than about 600° C., each of the silicon or nitrogen monolayers may be formed at a thickness of between about 1.0 Å and about 1.5 Å, such as about 1.2 Å in each deposition cycle ranging from about 1.0 second to about 2.0 seconds.

By forming the barrier material 116 by ALD or CVD, for example, the barrier material 116 is formed using a so-called "self-limiting" process. In other words, deposition of each monolayer of silicon or nitrogen may be constrained (e.g., restricted) as the materials and/or precursors becoming saturated during the deposition process. Thus, the barrier material 116 comprising a silicon nitride material may comprise a so-called "silicon nitride (SiN) termination" material. Once the desired thickness of the barrier material 116 is reached, the deposition process may be discontinued (e.g., terminated). Optionally, a native oxide material (not shown) may be formed adjacent (e.g., overlying) exposed surfaces of the first conductive material 114 and/or the barrier material 116 (FIG. 1B). In other embodiments, the barrier material 116 may suppress (e.g., inhibit, prevent) undesirable surface oxidation of the first conductive material 114 that may otherwise negatively impact contact resistance.

With continued reference to FIG. 1C, a second conductive material 118 may be formed adjacent (e.g., on or over) surfaces of the barrier material 116. As shown in FIG. 1C, the second conductive material 118 may at least partially (e.g., substantially) cover upper surfaces of the barrier material 116 and extend from and between side surfaces (e.g., sidewalls) of the barrier material 116 as well as over the horizontal surfaces of the barrier material 116. In other words, the second conductive material 118 may substantially fill the remainder of the access line trenches 108 and also form over the horizontal surfaces of the barrier material 116. The second conductive material 118 may be formed to exhibit any desirable thickness. By way of non-limiting example, the second conductive material 118 may be formed to a thickness of between about 50 Å and about 750 Å, such as between about 50 Å and about 150 Å, between about 150 Å and about 300 Å, between about 300 Å and about 500 Å, or between about 500 Å and about 750 Å. The thickness (e.g., average thickness) of the first conductive material 114 may be relatively less than the thickness (e.g., average thickness) of the second conductive material 118, and the thickness (e.g., average thickness) of the barrier material 116 may be relatively less than the thickness (e.g., average thickness) of each of the first conductive material 114 and the second conductive material 118.

As shown in FIG. 1C, the barrier material 116 may substantially surround (e.g., substantially continuously surround) the second conductive material 118 on at least three (3) sides. In other words, the barrier material 116 may substantially completely cover the bottom surface and side surfaces (e.g., sidewalls) of the second conductive material 118. The barrier material 116 may horizontally intervene between the side surfaces of the second conductive material 118 and side surfaces of the first conductive material 114 and may vertically intervene between the bottom surface of the second conductive material 118 and the upper surface of the first conductive material 114. Further, the barrier material 116 may function as an interface between the first conductive material 114 and the second conductive material 118 such that the reactive species (e.g., chlorine ions, fluorine ions) are restrained from passing from the second conductive material 118 to the first insulating material 110. In other words, the barrier material 116 may be configured to suppress migration of the reactive species from the second conductive material 118 to the first insulating material 110. The reactive species may be generated during the formation of the second conductive material 118, such as from the ligands of the metal precursors. In particular, the barrier material 116 may substantially inhibit (e.g., impede, prevent) the formation of so-called "chlorine-related trap sites" within the gate dielectric material (e.g., the first insulating material 110 and the second insulating material 112) since the barrier material 116 may substantially suppress the migration (e.g., diffusion) of chlorine ions from the metal precursor through the first conductive material 114 and into the first insulating material 110 and/or the base material 102.

The second conductive material 118 may be formed of and include at least one electrically conductive material, such as one of the transition metal materials or metal nitride materials described above for the first conductive material 114. In some embodiments, the second conductive material 118 comprises titanium nitride $TiN_y$ (e.g., TiN). In other embodiments, the second conductive material 118 comprises tungsten (W). In yet other embodiments, the second conductive material 118 comprises ruthenium (Ru). The first conductive material 114 and the second conductive material 118 may be the same material as one another or a different material from one another. In addition, the first conductive material 114 and/or the second conductive material 118 may be formed of and include a crystalline material. For example, the first conductive material 114 and the second conductive material 118 may include a columnar grain structure. Further, the barrier material 116 may be formed of and include an amorphous material. In particular, materials of each of the first conductive material 114 and the second conductive material 118 may be formed to exhibit desired orientations of a columnar grain structure (e.g., a continuous or discontinuous columnar grain structure). Without being limited to any theory, it is believed that the columnar grain structure substantially reduces (e.g., blocks) diffusion of the reactive species through the grain boundaries between the second conductive material 118 and the barrier material 116 and through the grain boundaries between the barrier material 116 and the first conductive material 114 during formation of the second conductive material 118 and/or during use and operation of the access line structure 100. In other words, forming the barrier material 116 having an amorphous material between each of the first conductive material 114 and the second conductive material 118 having a columnar grain structure may substantially reduce diffusion (e.g., by obstructing a pathway) of the reactive species at the grain boundaries therebetween. By way of non-limiting example, the barrier material 116 may include a silicon nitride material having an amorphous structure, while one or both (e.g., each) of the first conductive material 114 and the second conductive material 118 include a metal nitride material (e.g., TiN) having a crystalline structure (e.g., a columnar grain structure).

The second conductive material 118 may be formed using one or more conventional conformal deposition processes, such as one or more of a conventional conformal CVD process, a conventional ALD process, a conventional single wafer device, and a conventional furnace process. The access line structure 100 (at the processing stage depicted in FIG. 1C) may, for example, be provided into the deposition device configured to receive the sequential pulses of the metal-containing precursor and the nitrogen-containing precursor. The metal-containing precursor may comprise a complex of at least one metal species (e.g., Ti, W, Ta, Co, Mo, Ni) of the second conductive material 118 and at least one ligand formulated to react with the nitrogen-containing precursor to form the second conductive material 118. The ligand may include chemical elements that are reactive in ionic form, such as chlorine atoms or fluorine atoms. In some embodiments, the metal-containing precursor comprises titanium tetrachloride ($TiCl_4$) and the nitrogen-containing precursor comprises $NH_3$.

In some embodiments, the second conductive material 118 may be formed in situ with the first conductive material 114 and the barrier material 116. The second conductive material 118 may, for example, be formed on the barrier material 116 without moving (e.g., transferring) the access line structure 100 from the deposition device employed to form the first conductive material 114 and the barrier material, as discussed above, and into an additional deposition device. By way of non-limiting example, the first conductive material 114, the barrier material 116, and the second conductive material 118 may each be formed using a conventional ALD process, a conventional CVD process, a conventional single wafer process or a conventional furnace process, in the same deposition device. Accordingly, each of the first conductive material 114, the barrier material 116, and the second conductive material 118 may be formed using a single, continuous deposition process (e.g., a single, continuous ALD process; a single, continuous CVD process, a continuous single wafer process) or, alternatively, as a batch process (e.g., a furnace batch process). In additional embodiments, the first conductive material 114, the barrier material 116, and/or the second conductive material 118 may be formed ex-situ. For example, the access line structure 100 may be removed from the deposition device (e.g., the ALD chamber, the CVD chamber, the single wafer device, the furnace) employed to form the first conductive material 114 and/or the barrier material 116, and transferred to a different deposition chamber before forming the second conductive material 118 on the barrier material 116 through an additional conformal deposition process. Alternatively, the second conductive material 118 may be formed using one or more conventional non-conformal deposition processes, such as one or more of a conventional PVD process (e.g., a conventional radio frequency PVD (RFPVD) process), a conventional non-conformal CVD process, a conventional non-conformal single wafer process, and a conventional non-conformal furnace process.

In embodiments according to the disclosure, the presence of the barrier material 116 (e.g., silicon nitride) between the two titanium nitride materials (e.g., the first conductive material 114 and the second conductive material 118) may substantially impede diffusion of chlorine or fluorine reactive species, for example, from the second conductive material 118 and into the first insulating material 110 and/or the base material 102 during the formation of the second conductive material 118. The barrier material 116 may also prevent diffusion of the reactive species during subsequent removal (e.g., recessing) acts, such as removing portions of the materials within the access line trenches 108 (FIG. 1B), and/or during use and operation of the access line structure 100. In embodiments including tungsten (W) or a tungsten nitride (WN$_y$) material as the second conductive material 118, the barrier material 116 may impede (e.g., inhibit, prevent) undesirable diffusion of chlorine ions or fluorine ions, for example, from the second conductive material 118 and into the first insulating material 110, and/or the base material 102.

Figure 1D:
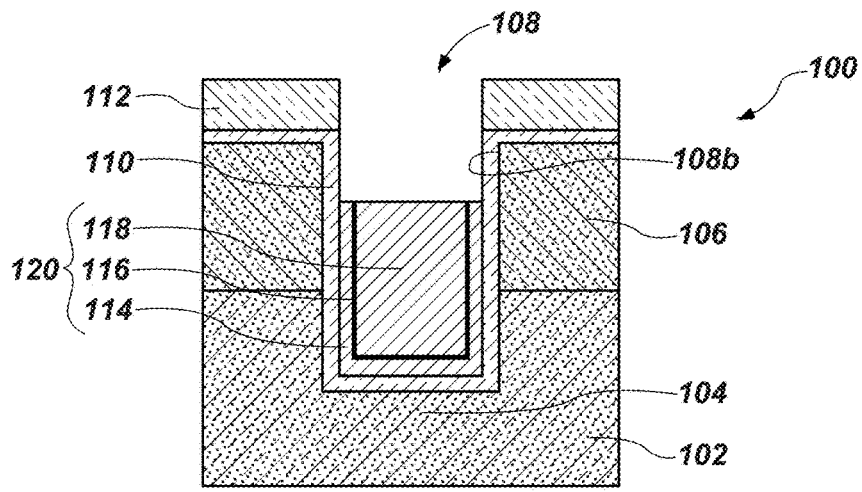

Referring next to FIG. 1D, one or more removal acts may be conducted to remove portions of the first conductive material 114, the barrier material 116, and the second conductive material 118 extending over the upper surface of the base material 102 (e.g., over an exposed upper surface of the second insulating material 112), as well as portions of the first conductive material 114, the barrier material 116, and the second conductive material 118 within the access line trenches 108, as shown in FIG. 1D. In particular, upper portions of each of the first conductive material 114, the barrier material 116, and the second conductive material 118 may be removed by conventional techniques, forming a gate structure 120 within the access line trenches 108. The gate structure 120 includes recessed portions of the first conductive material 114, the barrier material 116, and the second conductive material 118 remaining in the access line trenches 108. Following the removal act, each of the first conductive material 114, the barrier material 116, and the second conductive material 118 may partially fill the access line trenches 108, with a portion of the sidewalls of at least one (e.g., both) of the first insulating material 110 and the second insulating material 112 (e.g., a gate dielectric material) extending along the side surfaces 108b of the access line trenches 108 exposed. By way of example only, one or more dry etch acts may be conducted to recess the portions of the first conductive material 114, the barrier material 116, and the second conductive material 118 in the access line trenches 108. The removal act may generate reactive species depending on the etch chemistry and etch conditions that are used. For example, if chlorine-based or fluorine-based etch chemistries are used to recess the first conductive material 114, the barrier material 116, and the second conductive material 118, the reactive species may include chlorine ions or fluorine ions. Further, the barrier material 116 may be positioned and configured to restrain movement of the reactive species, such as ions (e.g., chlorine, fluorine) between the second conductive material 118 and the first insulating material 110 using the barrier material 116, such that the first insulating material 110 remains substantially free of the reactive species during deposition acts and removal acts of the second conductive material 118.

Figure 1E:
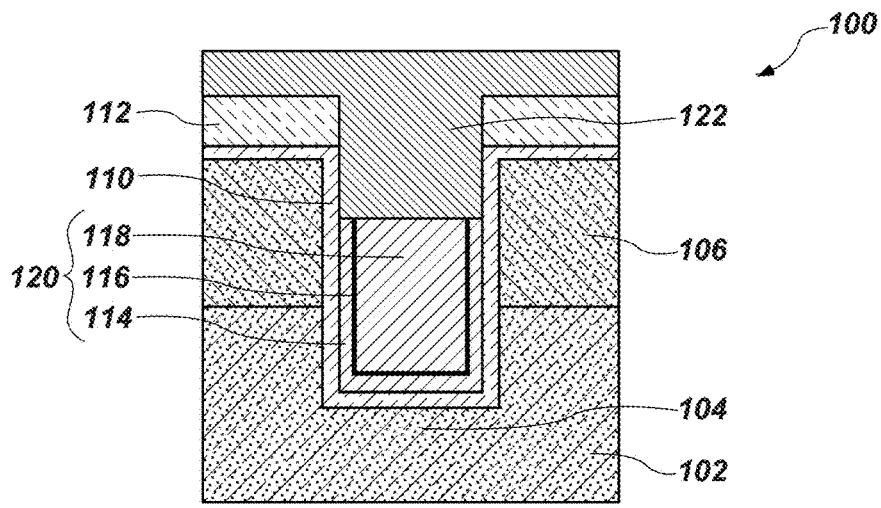

Referring to FIG. 1E, a conductive structure 122 (e.g., a conductive plug) may be formed within a remaining (e.g., unfilled) portion of the access line trenches 108 (FIG. 1D). As shown in FIG. 1E, the conductive structure 122 may be formed on (e.g., over) portions of each of the first conductive material 114, the barrier material 116, and the second conductive material 118 within the access line trenches 108 and may horizontally extend from and between opposing side surfaces of the first insulating material 110 within the access line trenches 108. The conductive structure 122 may also overlay upper surfaces of the second insulating material 112. The conductive structure 122 may be formed by conventional techniques.

The conductive structure 122 may be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive structure 122 may be formed of and include one or more of tungsten (W), tungsten nitride (WN$_y$), nickel (Ni), tantalum (Ta), tantalum nitride (TaN$_y$), tantalum silicide (TaSi$_x$), platinum (Pt), copper (Cu), silver (Ag), gold (Au), aluminum (Al), molybdenum (Mo), titanium (Ti), titanium nitride (TiN$_y$), titanium silicide (TiSi$_x$), titanium silicon nitride (TiSi$_x$N$_y$), titanium aluminum nitride (TiAl$_x$N$_y$), molybdenum nitride (MoN$_x$), iridium (Ir), iridium oxide (IrO$_z$), ruthenium (Ru), ruthenium oxide (RuO$_z$), and conductively doped silicon. In some embodiments, the conductive structure 122 is formed of and includes tungsten (W).

Figure 1F:
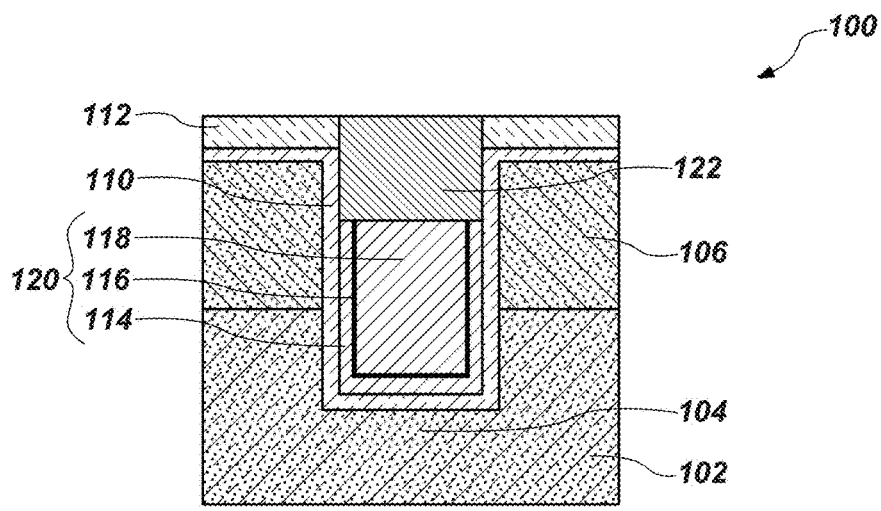

Referring to FIG. 1F, a portion of the conductive structure 122 vertically extending beyond a horizontal plane defined by the upper surface of the second insulating material 112 may be removed using one or more conventional material removal processes (e.g., by way of an abrasive planarization act, such as a chemical mechanical planarization (CMP) act) to form the conductive structure 122 within the access line trenches 108 and expose the upper surface of the second insulating material 112. An upper surface of the conductive structure 122 may be substantially coplanar with the upper surfaces of the second insulating material 112. In some embodiments, substantially none of the second insulating material 112 is removed in the removal act. In other embodiments, a portion (e.g., an upper portion, substantially all) of the second insulating material 112 may be removed in the removal act.

As shown in FIG. 1F, the access line structure 100 including the first conductive material 114, the barrier material 116, and the second conductive material 118 provides improved row hammer characteristics to an electronic device including the access line structure 100. Without being bound by any theory, it is believed that the barrier material 116 functions to impede (e.g., inhibit, prevent) undesirable diffusion of the reactive species through the first conductive material 114 and into the first insulating material 110 and/or the base material 102. Without being bound to any theory, it is believed that the barrier material 116 improves the "row hammer" characteristic of the electronic device by lowering the likelihood for the electronic device to experience undesirable leakage between adjacent access line structures 100. It was unexpected and surprising that the barrier material 116 in the access line structure 100 would improve the row hammer properties at such a minimal thickness of the barrier material 116, such as about 3.6 Å. Since the barrier material 116 (e.g., silicon nitride) is known in the art to be an insulating material, it was unexpected and surprising for the barrier material 116 to function as a barrier material when present at a thickness within the thickness range previously described. The barrier material 116 may improve the row hammer performance (e.g., may reduce leakage) of the access line structure 100 in use and operation in the electronic device by reducing (e.g., preventing) the formation of trap sites, such as chlorine-related trap sites or fluorine-related trap sites, in the gate dielectric material that may result in defects within (e.g., at the interface of) the gate dielectric material. Therefore, the barrier material 116 of the access line structure 100 according to embodiments of the disclosure was determined to improve the row hammer performance properties of the electronic device as well as increase its threshold voltage.

Accordingly, an apparatus comprising a memory array comprising access lines is disclosed. Each of the access lines comprises an insulating material adjacent a bottom surface and sidewalls of a base material, a first conductive material adjacent the insulating material, a second conductive material adjacent the first conductive material, and a barrier material between the first conductive material and the second conductive material. The barrier material is configured to suppress migration of reactive species from the second conductive material.

Aspects (e.g., processing acts and structures) of the methods described above with reference to FIGS. 1A through 1F may be employed in additional methods of forming an apparatus to facilitate one or more benefits (e.g., at least some of the benefits effectuated by the methods previously described with reference to FIGS. 1A through 1F, and/or additional benefits) as compared to conventional methods and conventional apparatuses. For example, the access line structure 100 including the first conductive material 114, the barrier material 116, and the second conductive material 118 provides improved row hammer characteristics to an electronic device including the access line structure 100 as compared to many conventional electronic devices including wordline structures since the barrier material 116 may impede (e.g., inhibit, prevent) undesirable diffusion of the reactive species, for example, through the first conductive material 114 and into the first insulating material 110 and/or the base material 102, and improves the "row hammer" characteristic of the memory device by lowering the likelihood for the electronic device including the access line structure 100 to experience undesirable leakage between adjacent access line structures 100. Furthermore, the methods of the disclosure may reduce or eliminate process acts utilized to form many conventional apparatuses that may be used for similar operations as the access line structure 100. By using a single deposition act within a single chamber, the access line structures 100 according to embodiments of the disclosure are formed utilizing fewer process acts than conventional wordline structures.

Accordingly, a method of forming an apparatus is also disclosed. The method comprises forming at least one insulating material within and adjacent to trenches in a base material, forming a first conductive material adjacent to exposed surfaces of at least one insulating material, forming a barrier material adjacent to the first conductive material, and forming a second conductive material adjacent to the barrier material. The barrier material is formulated to reduce diffusion of reactive species from the second conductive material and into the at least one insulating material.

Figure 2:
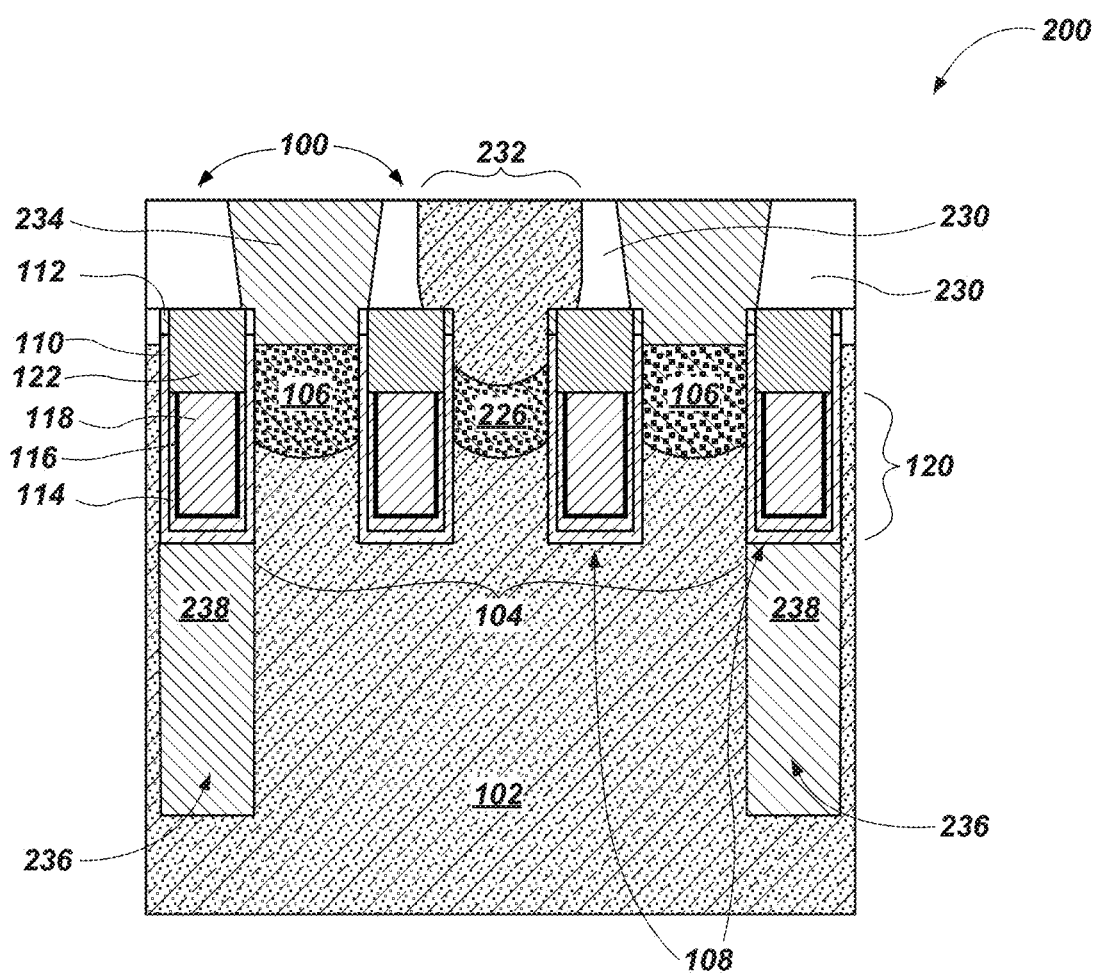
FIG. 2 is a cross-sectional view of a microelectronic device including the access line structure, in accordance with embodiments of the disclosure.

Additional process acts may be conducted on the access line structure 100 to form a microelectronic device 200 (e.g., an apparatus) that includes one or more access line structures 100 and additional components, as shown in FIG. 2. The process acts may be conducted by conventional techniques. The microelectronic device 200 includes the drain regions 106, a source region 226 within the active area 104, a dielectric material 230, a contact material 234, isolation trenches 236, and another dielectric material 238. The microelectronic device 200 also includes the gate structure 120, at least one data line 232 (e.g., bit line), and at least one memory cell (not shown). Each memory cell is coupled to an associated gate structure 120 (e.g., access line, wordline) and an associated data line 232. A digit line contact (not shown) including the contact material 234 extends vertically to the data line 232 to allow electrical communication with more distal components of the microelectronic device 200 that includes the access line structure 100. Contacts formed from the contact material 234 are in electrical communication with the drain regions 106. The dielectric material 230 may be adjacent (e.g., overlying) at least a portion of the access line trenches 108, which include the conductive structure 122, the first insulating material 110, the second insulating material 112, the first conductive material 114, the barrier material 116, and the second conductive material 118 therein. Further, the contact material 234 and the data line 232 may be separated from one another by the dielectric material 230, as shown in FIG. 2.

The isolation trenches 236 provide shallow trench isolation (STI) for the active areas 104 of the base material 102. The isolation trenches 236 may be defined by sidewalls of the base material 102. The isolation trenches 236 may be partially filled with the another dielectric material 238, such as at the bottom of the isolation trenches 236. The another dielectric material 238 may include, but is not limited to, an oxide (e.g., silicon dioxide ($SiO_2$)), a nitride (e.g., silicon nitride (SiN)), or an oxynitride. One or more of the isolation trenches 236 may include one of the access line trenches 108. For example, one access line trench 108 may be formed within one of the isolation trenches 236. The isolation trenches 236 may also contain the first conductive material 114, the barrier material 116, the second conductive material 118, and the another dielectric material 238. One or more gate dielectric materials (e.g., the first insulating material 110 and/or the second insulating material 112) may be present in the isolation trenches 236, such as on sidewalls of the base material 102, while the another dielectric material 238 is present in the bottom of the isolation trenches 236. The first insulating material 110 and/or the second insulating material 112 may surround the first conductive material 114, the barrier material 116, and the second conductive material 118 in the isolation trenches 236. The dielectric material 230, the another dielectric material 238, and the gate dielectric materials may be the same material as one another or a different material from one another. The first insulating material 110 may be over (e.g., directly over, directly adjacent to, vertically adjacent to) the another dielectric material 238 in the isolation trenches 236, the second insulating material 112 may be adjacent (e.g., directly adjacent to, over, directly over) the first insulating material 110. The remainder of the isolation trenches 236 may contain the another dielectric material 238.

The microelectronic device 200 also includes the active areas 104, which may be aligned at an angle (e.g., at about a forty-five degree angle) relative to the alignment of the wordlines (e.g., gate structure 120) within the access line trenches 108 and the data lines 232 within the isolation trenches 236. In the active areas 104, a pair of the access line trenches 108 may separate the source region 226 from the drain regions 106, with the drain regions 106 disposed to either side of the source region 226. The source region 226 and drain regions 106 may be defined by doped areas of the base material 102 proximate an upper surface of the base material 102. For example, the source region 226 and the drain regions 106 may be doped with an n-type dopant or with a p-type dopant. The source region 226 and the drain regions 106 may be formed by conventional techniques. Each wordline (e.g., the gate structure 120) is isolated from the source region 226 and the drain regions 106 of an array (e.g., memory array) by the gate dielectric material (e.g., the first insulating material 110 and/or the second insulating material 112). In some embodiments, the microelectronic device 200 is a dynamic random access memory (DRAM) device.

Accordingly, a memory device comprising access lines is disclosed. Each of the access lines comprises an insulating material adjacent a bottom surface and sidewalls of a base material, a first conductive material adjacent the insulating material, a second conductive material adjacent the first conductive material, and a barrier material between the first conductive material and the second conductive material. The barrier material is configured to suppress migration of reactive species from the second conductive material.

Figure 3:
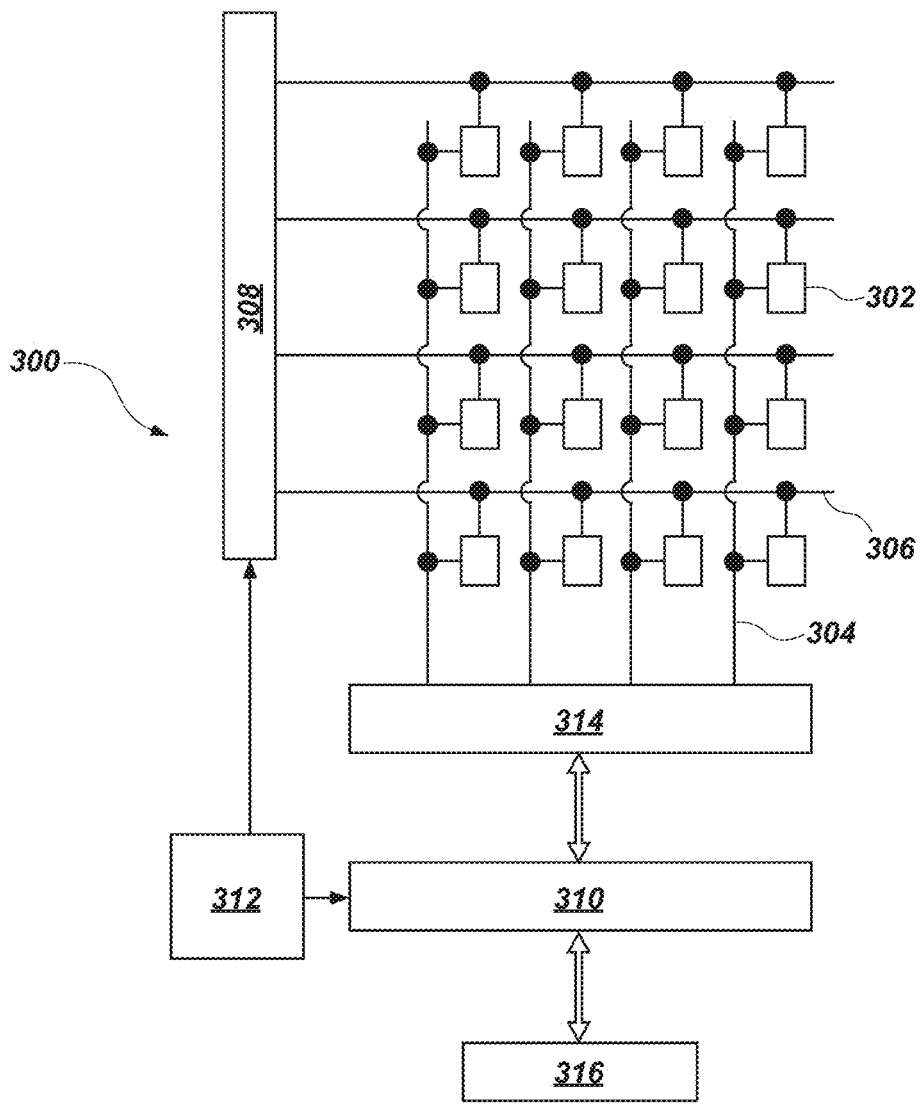
FIG. 3 is a functional block diagram of a memory device, in accordance with embodiments of the disclosure.

FIG. 3 illustrates a functional block diagram of a memory device 300 (e.g., a DRAM device), in accordance with an embodiment of the disclosure. The memory device 300 may include, for example, an embodiment of the access line structure 100, for example, previously described herein. As shown in FIG. 3, the memory device 300 may include memory cells 302, digit lines 304, word lines 306, a row decoder 308, a column decoder 310, a memory controller 312, a sense device 314, and an input/output device 316.

The memory cells 302 of the memory device 300 are programmable to at least two different logic states (e.g., logic 0 and logic 1). The access line structures 100 according to embodiments of the disclosure may be included in the memory cells 302 of the memory device 300. Each memory cell 302 may individually include a storage node structure and transistor. The storage node structure stores a charge representative of the programmable logic state (e.g., a charged capacitor may represent a first logic state, such as a logic 1; and an uncharged capacitor may represent a second logic state, such as a logic 0) of the memory cell 302. The transistor grants access to the capacitor responsive to application of a minimum threshold voltage to a semiconductive channel thereof for operations (e.g., reading, writing, rewriting) on the storage node structure.

The digit lines 304 are connected to the storage node structures of the memory cells 302 by way of the transistors of the memory cells 302. The word lines 306 extend perpendicular to the digit lines 304, and are connected to gates of the transistors of the memory cells 302. Operations may be performed on the memory cells 302 by activating appropriate digit lines 304 and word lines 306. Activating a digit line 304 or a word line 306 may include applying a voltage potential to the digit line 304 or the word line 306. Each column of memory cells 302 may individually be connected to one of the digit lines 304, and each row of the memory cells 302 may individually be connected to one of the word lines 306. Individual memory cells 302 may be addressed and accessed through the intersections (e.g., cross points) of the digit lines 304 and the word lines 306.

The memory controller 312 may control the operations of memory cells 302 through various components, including the row decoder 308, the column decoder 310, and the sense device 314. The memory controller 312 may generate row address signals that are directed to the row decoder 308 to activate (e.g., apply a voltage potential to) predetermined word lines 306, and may generate column address signals that are directed to the column decoder 310 to activate (e.g., apply a voltage potential to) predetermined digit lines 304. The memory controller 312 may also generate and control various voltage potentials employed during the operation of the memory device 300. In general, the amplitude, shape, and/or duration of an applied voltage may be adjusted (e.g., varied), and may be different for various operations of the memory device 300.

During use and operation of the memory device 300, after being accessed, a memory cell 302 may be read (e.g., sensed) by the sense device 314. The sense device 314 may compare a signal (e.g., a voltage) of an appropriate digit line 304 to a reference signal in order to determine the logic state of the memory cell 302. If, for example, the digit line 304 has a higher voltage than the reference voltage, the sense device 314 may determine that the stored logic state of the memory cell 302 is a logic 1, and vice versa. The sense device 314 may include transistors and amplifiers to detect and amplify a difference in the signals (commonly referred to in the art as "latching"). The detected logic state of a memory cell 302 may be output through the column decoder 310 to the input/output device 316. In addition, a memory cell 302 may be set (e.g., written) by similarly activating an appropriate word line 306 and an appropriate digit line 304 of the memory device 300. By controlling the digit line 304 while the word line 306 is activated, the memory cell 302 may be set (e.g., a logic value may be stored in the memory cell 302). The column decoder 310 may accept data from the input/output device 316 to be written to the memory cells 302. Furthermore, a memory cell 302 may also be refreshed (e.g., recharged) by reading the memory cell 302. The read operation will place the contents of the memory cell 302 on the appropriate digit line 304, which is then pulled up to full level (e.g., full charge or discharge) by the sense device 314. When the word line 306 associated with the memory cell 302 is deactivated, all of memory cells 302 in the row associated with the word line 306 are restored to full charge or discharge.

Figure 4:
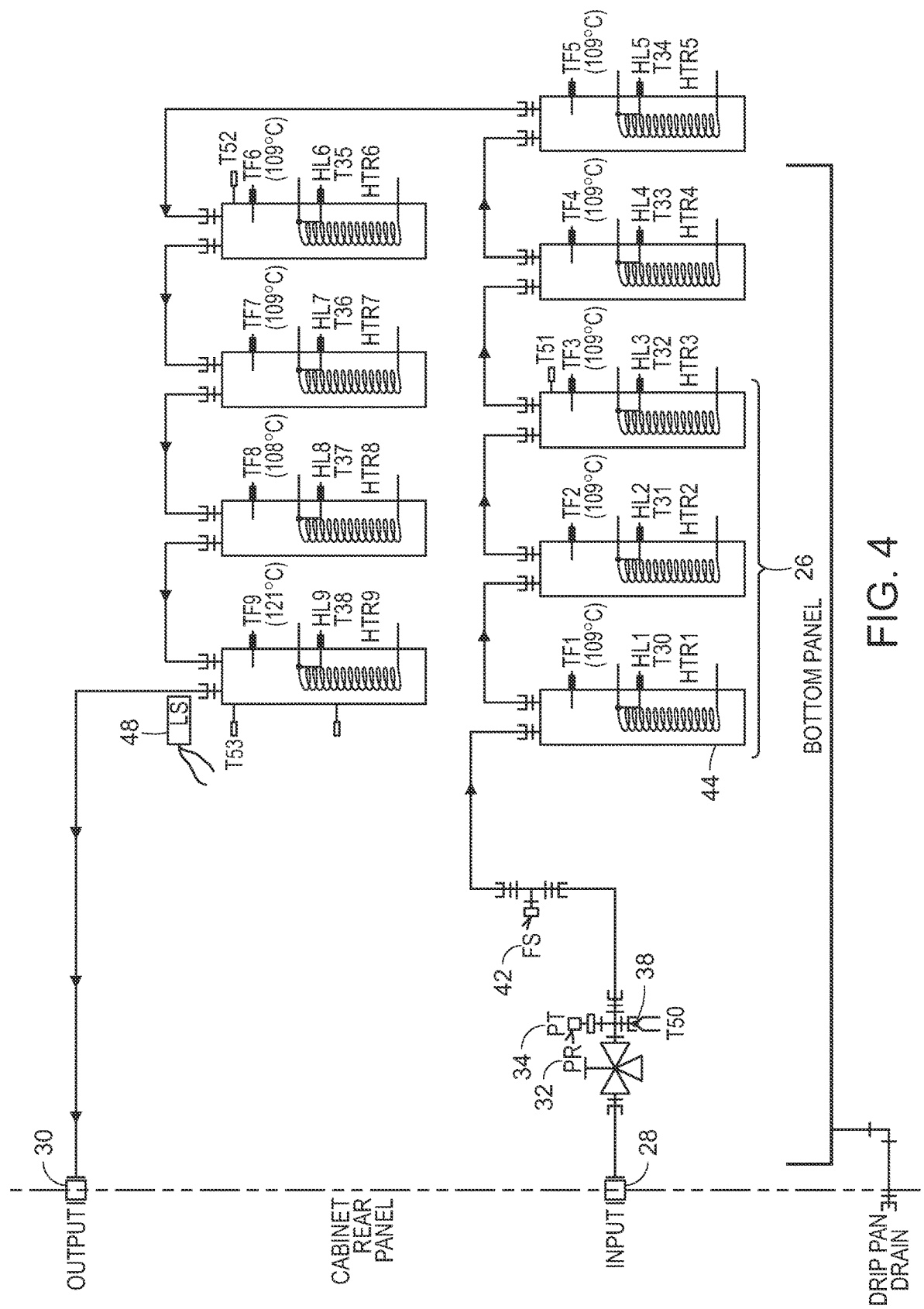
FIG. 4 is a schematic block diagram of an electronic system, in accordance with embodiments of the disclosure.

An apparatus including the access line structure 100 and microelectronic devices (e.g., the memory device 300) incorporating same in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, one or more of a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, and a navigation device. The electronic system 400 includes at least one memory device 402. The memory device 402 may comprise, for example, an embodiment of an apparatus (e.g., the access line structure 100) incorporated in a microelectronic device (e.g., the memory device 300) previously described herein. The electronic system 400 may further include at least one electronic signal processor device 404 (often referred to as a "microprocessor"). The electronic signal processor device 404 may, optionally, include an embodiment of an apparatus (e.g., the access line structure 100) incorporated in a microelectronic device (e.g., the memory device 300) previously described herein, such an arrangement often being termed a "system on a chip" (SoC). The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, an electronic system according to embodiments of the disclosure comprises an input device, an output device, a processor device operably coupled to the input device and the output device, and a memory device operably coupled to the processor device and comprising memory cells. One or more of the memory cells comprise one or more insulating materials adjacent a bottom surface and sidewalls of a base material, a first conductive material overlying the one or more insulating materials, a barrier material overlying the first conductive material, and a second conductive material overlying the barrier material, the barrier material formulated to prevent diffusion of reactive species from the second conductive material.

The following example serves to explain embodiments of the disclosure in more detail. This example is not to be construed as being exhaustive or exclusive as to the scope of this disclosure.

EXAMPLE 1

Access line structures similar to those shown in FIG. 1F were prepared as described above for FIGS. 1A-1F. Samples of the access line structures included two portions of a conductive material (e.g., titanium nitride) and a barrier material (e.g., silicon nitride) between the two portions of the conductive material. Three (3) samples were prepared having differing thicknesses of silicon nitride positioned between the two portions of titanium nitride. The three samples were prepared using DCS as the silicon precursor and ammonia as the nitrogen precursor in a deposition chamber using a single, continuous ALD process at a temperature of greater than about 600° C. A first sample was prepared where the silicon nitride was formed at a thickness of about 3.6 Å using three (3) deposition cycles (e.g., loop counts) of the silicon nitride. A second sample was prepared where the silicon nitride was formed at a thickness of about 12 Å using ten (10) deposition cycles of the silicon nitride, and a third sample was prepared where the silicon nitride was formed at a thickness of about 18 Å using fifteen (15) deposition cycles of the silicon nitride. After forming and recessing the materials (e.g., the titanium nitride and the silicon nitride) within the access line trenches, a conductive structure was formed thereover, producing the access line structures.

For comparison, a control sample was prepared as described above except that a single titanium nitride material was formed, without depositing silicon nitride. Thus, no silicon nitride was present in the control sample.

Figure 5:
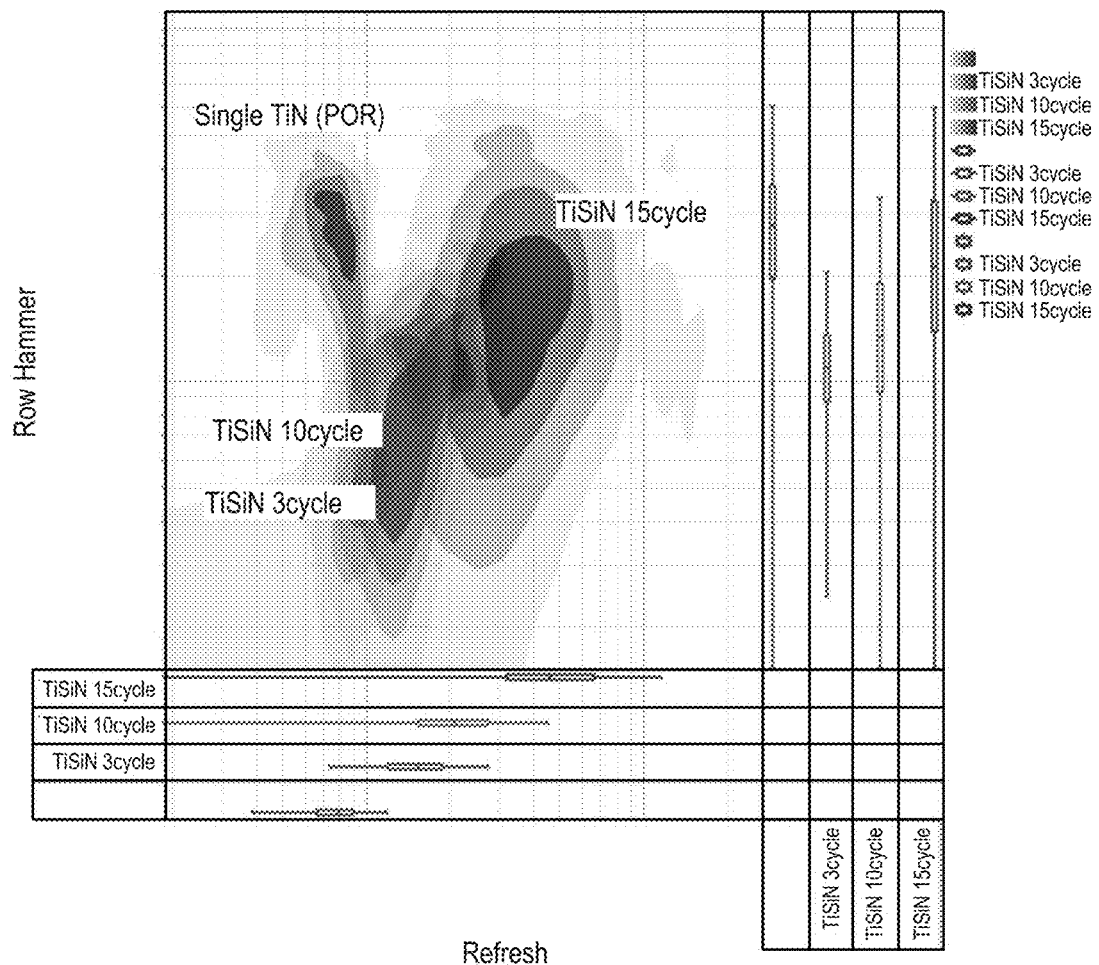
FIG. 5 is a plot of row hammer performance as a function of a number of deposition cycles of a barrier material.

The row hammer properties of the samples were determined by conventional techniques. As shown in FIG. 5, the row hammer performance of the samples including the silicon nitride between the two portions of the titanium nitride exhibited improved row hammer performance without decreasing the refresh properties. FIG. 5 shows the number of fail bits caused by a row hammer test as a function of the number of fail bits caused by a refresh test. In the row hammer test, an aggressor access line (e.g., wordline) is repeatedly activated and deactivated 5000 times. The fail bits caused by the row hammer test are coupled to victim access lines that are adjacent to the aggressor access lines. The refresh test included operations performed at a cycle of 80 msec. The samples including access line structures according to embodiments of the disclosure were prepared using three (3) deposition cycles (labeled TiSiN 3cycle in FIG. 5), ten (10) cycles (labeled TiSiN 10cycle in FIG. 5), and fifteen (15) cycles (labeled TiSiN 15cycle in FIG. 5). The control sample (labeled Single TiN sample in FIG. 5) included no silicon nitride. The samples (TiSiN 3cycle, TiSiN 10cycle, TiSiN 15cycle) including the silicon nitride exhibited lower row hammer performance without substantially affecting the refresh rate compared to the control access line structure (Single TiN sample), as shown in FIG. 5.

Further, the sample prepared using three (3) deposition cycles (TiSiN 3cycle) exhibited improved (e.g., lower) row hammer performance without significantly affecting resistance compared to the two remaining samples (TiSiN 10cycle, TiSiN 15cycle). Therefore, it was determined that even a minimal amount of silicon nitride located between the two portions of the titanium nitride resulted in improved row hammer performance. It was unexpectedly found, however, that the access line structure including the silicon nitride at a thickness below about 3.6 Å (e.g., formed by using less than three (3) deposition cycles) provided substantially the same row hammer properties as a conventional wordline structure (e.g., a wordline structure lacking the barrier material) and that an access line structure including the barrier material at a thickness above about 18 Å (e.g., formed by using 15 or more deposition cycles) may result in an undesirable level of increased resistivity within the electronic device. In addition, the sample prepared using three (3) deposition cycles (TiSiN 3cycle) exhibited lower resistivity relative to the control access line structure (Single TiN sample), which results were also unexpected. A reduction in resistivity of about 33 percent was observed with the TiSiN 3cycle sample, as well as an improvement in uniformity (e.g., step coverage) was also observed to be about three (3) times higher than that of the Single TiN sample. These results are believed to indicate improved performance of the insulating material (e.g., gate dielectric material) to isolate the conductive materials as a result of reducing (e.g., preventing) formation of chlorine-related trap sites that may result in defects within (e.g., at the interface of) the gate dielectric material. One of ordinary skill in the art will appreciate that selective placement (e.g., thicknesses) of materials as well as formation of such materials, including types of materials, precursors, processing conditions (e.g., temperature) and the like, may be selected to achieve the desired performance requirements while minimizing undesirable levels of resistivity, which variables may be optimized to achieve improved row hammer properties.

The methods, apparatuses, devices (e.g., memory devices, such as DRAM devices), and electronic systems of the disclosure may facilitate one or more of increased performance, increased efficiency, increased reliability, and increased durability as compared to conventional methods, conventional apparatuses, conventional devices, and conventional electronic systems.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. An apparatus, comprising:
a memory array comprising access lines extending through a base material comprising at least one drain region and at least one source region, each of the access lines comprising:
an insulating material adjacent a bottom surface and sidewalls of the base material;
a first conductive material adjacent the insulating material and laterally adjacent to the at least one drain region and the at least one source region;
a second conductive material adjacent the first conductive material; and
a barrier material between the first conductive material and the second conductive material, the barrier material comprising a silicon nitride material having an amorphous structure and configured to suppress migration of reactive species from the second conductive material, each of the first conductive material and the second conductive material having a columnar grain structure at grain boundaries with the barrier material.

2. The apparatus of claim 1, wherein the first conductive material comprises a first metal nitride material and the second conductive material comprises a second metal nitride material.

3. The apparatus of claim 2, wherein each of the first metal nitride material and the second metal nitride material comprises titanium nitride, and the barrier material is configured to suppress migration of chlorine from the second metal nitride material.

4. The apparatus of claim 1, wherein the first conductive material comprises titanium nitride and the second conductive material comprises tungsten, the barrier material configured to suppress migration of fluorine from the tungsten.

5. The apparatus of claim 1, wherein the barrier material is directly adjacent upper surfaces and sidewalls of the first conductive material and the second conductive material is directly adjacent upper surfaces and sidewalls of the barrier material.

6. The apparatus of claim 1, wherein an average thickness of the first conductive material is relatively less than an average thickness of the second conductive material and an average thickness of the barrier material is relatively less than an average thickness of the first conductive material.

7. The apparatus of claim 1, wherein the first conductive material adjacent the insulating material comprises a uniform thickness along a length thereof.

8. The apparatus of claim 1, wherein the barrier material comprises a uniform thickness along a length thereof.

9. The apparatus of claim 1, wherein the barrier material comprises a thickness between about 0.5 Å and about 30 Å.

10. A method of forming an apparatus, comprising:
forming at least one insulating material within and adjacent to trenches in a base material comprising at least one drain region and at least one source region;
forming a first conductive material adjacent to exposed surfaces of at least one insulating material and laterally adjacent to the at least one drain region and the at least one source region;
forming a barrier material adjacent to the first conductive material, the barrier material comprising a silicon nitride material having an amorphous structure; and
forming a second conductive material adjacent to the barrier material, each of the first conductive material and the second conductive material having a columnar grain structure at grain boundaries with the barrier material,
wherein the barrier material is formulated to reduce diffusion of reactive species from the second conductive material and into the at least one insulating material.

11. The method of claim 10, further comprising:
removing portions of each of the first conductive material, the barrier material, and the second conductive material to recess the first conductive material, the barrier material, and the second conductive material within the trenches,
wherein the barrier material is formulated to reduce diffusion of reactive species generated during removal of the second conductive material.

12. The method of claim 11, further comprising forming a conductive structure within the trenches and directly on the recessed first conductive material, the recessed barrier material, and the recessed second conductive material, wherein the conductive structure comprises at least one of a metal, an alloy, a conductive metal oxide, a conductive metal nitride, a conductive metal silicide, or a conductively doped semiconductor material.

13. The method of claim 10, wherein:
forming the first conductive material comprises forming a metal nitride material using a first conformal deposition process;
forming the barrier material comprises forming the silicon nitride material using a second conformal deposition process; and
forming the second conductive material comprises forming a second metal nitride material using a third conformal deposition process,
one or more of the first conformal deposition process, the second conformal deposition process, and the third conformal deposition process comprising an in situ conformal deposition process.

14. The method of claim 10, wherein forming each of the first conductive material, the barrier material, and the second conductive material comprises depositing each of the first conductive material, the barrier material, and the second conductive material in the same deposition chamber using a single, continuous ALD process or a single, continuous CVD process.

15. The method of claim 10, wherein forming the barrier material comprises forming the barrier material at a thickness of between about 0.5 Å and about 30 Å.

16. The method of claim 10, wherein forming the second conductive material adjacent to the barrier material comprises depositing a metal nitride material over upper surfaces and sidewalls of the barrier material using an ALD process, a CVD process, a PVD process, a single wafer process, a furnace process, or a combination thereof.

17. The method of claim 16, wherein depositing the metal nitride material over the upper surfaces and sidewalls of the barrier material comprises depositing a titanium nitride material on the upper surfaces and sidewalls of the silicon nitride material of the barrier material.

18. The method of claim 10, wherein forming the barrier material comprises conformally forming the silicon nitride material between two metal nitride materials.

19. An electronic system, comprising:
an input device;
an output device;
a processor device operably coupled to the input device and the output device; and a memory device operably coupled to the processor device and comprising memory cells, one or more of the memory cells comprising:
- one or more insulating materials adjacent a bottom surface and sidewalls of a base material comprising drain regions and at least one source region;
- a first conductive material overlying the one or more insulating materials with upper portions of the first conductive material vertically overlapping the drain regions and the at least one source region;
- a barrier material comprising an amorphous silicon nitride material overlying the first conductive material; and
- a second conductive material overlying the barrier material, each of the first conductive material and the second conductive material comprising a crystalline titanium nitride material, the barrier material formulated to prevent diffusion of reactive species from the second conductive material.

20. The electronic system of claim 19, further comprising:
a gate structure in trenches and vertically overlying the base material; and
a gate dielectric material between the gate structure and the base material, the gate dielectric material comprising at least a portion of the one or more insulating materials.

21. The electronic system of claim 19, wherein the barrier material substantially surrounds the second conductive material on at least three sides.

22. The electronic system of claim 19, wherein:
the first conductive material comprises an average thickness between about 15 Å and about 150 Å;
the barrier material comprises an average thickness between about 0.5 Å and about 30 Å; and
the second conductive material comprises an average thickness between about 50 Å and about 750 Å.

23. The apparatus of claim 1, wherein the base material comprises active regions comprising the at least one drain region and the at least one source region, the access lines extending through the base material adjacent the active regions.

24. The apparatus of claim 1, wherein the access lines are configured as word lines.

25. The apparatus of claim 1, further comprising data lines overlying the access lines and conductive plug structures located directly between the data lines and upper surfaces of the first conductive material, the second conductive material, and the barrier material.

26. The apparatus of claim 1, further comprising an additional insulating material vertically overlying the insulating material.

* * * * *

UNITED STATES PATENT AND TRADEMARK OFFICE
CERTIFICATE OF CORRECTION

PATENT NO. : 11,322,502 B2
APPLICATION NO. : 16/504681
DATED : May 3, 2022
INVENTOR(S) : Kim et al.

Page 1 of 1

It is certified that error appears in the above-identified patent and that said Letters Patent is hereby corrected as shown below:

In the Claims

Column 22, Line 27, Claim 13, change "metal nitride" to --first metal nitride--

Signed and Sealed this
Twentieth Day of September, 2022

Katherine Kelly Vidal
*Director of the United States Patent and Trademark Office*